(12) United States Patent
Okabe

(10) Patent No.: US 11,120,877 B2
(45) Date of Patent: Sep. 14, 2021

(54) SEMICONDUCTOR STORAGE DEVICE AND PROGRAM METHOD

(71) Applicant: Winbond Electronics Corp., Taichung (TW)

(72) Inventor: Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/894,895

(22) Filed: Jun. 8, 2020

(65) Prior Publication Data
US 2020/0395078 A1    Dec. 17, 2020

(30) Foreign Application Priority Data

Jun. 17, 2019    (JP) .............. JP2019-112184

(51) Int. Cl.
*G11C 16/04*    (2006.01)
*G11C 16/10*    (2006.01)
*G11C 16/24*    (2006.01)
*G11C 16/30*    (2006.01)

(52) U.S. Cl.
CPC .............. *G11C 16/10* (2013.01); *G11C 16/24* (2013.01); *G11C 16/30* (2013.01)

(58) Field of Classification Search
CPC .................................................. G11C 16/0483
USPC ....................................................... 365/185.09
See application file for complete search history.

(56) References Cited

U.S. PATENT DOCUMENTS 6,751,124 B2    6/2004    Lee
2014/0104947 A1*    4/2014    Yamauchi .......... G11C 16/0483
                                                                365/185.09

FOREIGN PATENT DOCUMENTS

| CN | 108399935 | 8/2018 |
| JP | H11176177 | 7/1999 |
| TW | 200915326 | 4/2009 |

* cited by examiner

*Primary Examiner* — Jason Lappas
(74) *Attorney, Agent, or Firm* — JCIPRNET

(57) ABSTRACT

A program method capable of reducing a peak current of a program operation is provided. The program method of a flash memory includes following steps: charging selective bit lines and non-selective bit lines by using a virtual voltage with weak driving ability during the time from t0 to t1 and a virtual voltage with strong driving ability during the time from t1 to t2, switching at least the non-selective bit lines to use the virtual voltage with weak driving ability for charging during at least the time from t2 to t3 when starting to discharge the selective bit lines connected to selective storage cells to a GND voltage level at time t2, and then applying program voltages to selective word lines.

11 Claims, 7 Drawing Sheets

SEMICONDUCTOR STORAGE DEVICE AND PROGRAM METHOD

CROSS-REFERENCE TO RELATED APPLICATION

This application claims the priority benefit of Japan application serial no. 2019-112184, filed on Jun. 17, 2019. The entirety of the above-mentioned patent application is hereby incorporated by reference herein and made a part of this specification.

BACKGROUND OF THE INVENTION

1. Field of the Invention

The disclosure relates to a semiconductor storage device such as a flash memory, in particular to restraint of a peak current of a program operation.

2. Description of Related Art

In a readout operation of an NAND flash memory, pages including even bit lines or pages including odd bit lines are alternately read out. When even pages are being read out, odd pages are removed from a sense amplifier and provided with mask potentials, when the odd pages are being read out, the even pages are removed from the sense amplifier and provided with mask potentials, and therefore noise produced by capacitive coupling between adjacent bit lines is lowered (e.g., Japan Invention Patent No. 11-176177).

SUMMARY OF THE INVENTION

In an NAND flash memory, a readout operation or a program operation is performed in pages, but when bit lines are distributed with narrow spacings due to increasing pages, the influence of capacitive coupling between the adjacent bit lines cannot be ignored. Therefore, one page is divided into ½ pages with an even page including even bit lines and an odd page including odd bit lines so as to make operations on the even page and the odd page different in time, so in appearance, distribution spacings between the bit lines are doubled, and the influence of capacitive coupling between the bit lines is restrained.

FIG. 1 is a figure representing a bit line selecting circuit for selecting an even bit line or an odd bit line. The figure illustrates a page buffer/readout circuit 10 shared by the even bit line and the odd bit line as well as the bit line selecting circuit connected thereto.

The bit line selecting circuit includes: a transistor BLSe configured to select the even bit line GBLe, a transistor BLSo configured to select the odd bit line GBLo, a transistor YBLe configured to connect a virtual voltage VIRPWR to the even bit line GBLe, and a transistor YBLo configured to connect the virtual voltage VIRPWR to the odd bit line GBLo. In addition, an NAND string is connected between the even bit line GBLe and a source line SL, and an NAND string is connected between the odd bit line GBLo and the source line SL.

FIG. 2 represents a condition that even bit lines GBLe are selected while odd bit lines GBLo are not selected. The even bit lines GBLe and the odd bit lines GBLo are distributed from the page buffer/readout circuit 10 in a manner of crossing a plurality of blocks, and distribution spacings are tiny. Therefore, a capacitance between the even bit lines GBLe and the odd bit lines GBLo adjacent thereto is increased.

There are mainly three operations (readout, programming and erasing) in the NAND flash memory, and a peak current will be produced when the operations are performed. For example, in order to generate a high voltage, a charge pump is set, or when voltages are applied to bit lines, a large current will be consumed so as to produce the peak current.

FIG. 3 represents a method of applying voltages to bit lines in a program operation. Referring to FIG. 1 and FIG. 3, a selective bit line and a non-selective bit line are simultaneously charged from the virtual voltage VIRPWR and the source line SL during the time from t0 to t1. At the moment, the transistors YBLe and YBLo of the bit line selecting circuit are turned on, and voltages are supplied to the selective bit line and the non-selective bit line from the virtual voltage VIRPWR and the source line SL at the same time.

FIG. 4 represents a virtual voltage drive circuit VIRPWR_DRV. The drive circuit VIRPWR_DRV generates a virtual voltage VIRPWR by using an externally supplied external supply voltage EXVDD (i.g., 3.3 V) and an internal supply voltage INTVDD (e.g., 1.8 V) so as to provide the virtual voltage VIRPWR to a bit line selecting circuit to charge bit lines. The drive circuit VIRPWR_DRV includes inverters IN1 to IN3, pull-up transistors P1 to P2 and a pull-down transistor N1. The pull-up transistor P1 is connected between the external supply voltage EXVDD and an output node Q, the pull-up transistor P2 is connected between the internal supply voltage INTVDD and the output node Q, the pull-down transistor N1 is connected between the output node Q and a ground terminal, and a high-voltage-resistant transistor HVNE is connected between the output node Q and an output end.

Herein, a driving ability of the pull-up transistor P2 is made stronger than a driving ability of the pull-up transistor P1. For example, a width/length (W/L) ratio of the pull-up transistor P2 may be made greater than a W/L ratio of the pull-up transistor P1, and therefore drain currents flowing when the pull-up transistor P2 is turned on are greater than drain currents flowing when the pull-up transistor P1 is turned on.

Referring to FIG. 3 and FIG. 4, the pull-up transistor P1 and the transistor HVNE are turned on and the pull-up transistor P2 and the pull-down transistor N1 are turned off by using a drive control circuit not shown during the time from t0 to t1. The external supply voltage EXVDD is provided to the output end as the virtual voltage VIRPWR via the pull-up transistor P1 with a weak driving ability, so that the virtual voltage VIRPWR has the weak driving ability at the moment. Then the bit line selecting circuit charges the selective bit line and the non-selective bit line through the virtual voltage VIRPWR with the weak driving ability, and since the bit lines have large capacitances and consume large currents when charged, a peak current will be produced. In order to lower the peak current, the peak current may be lowered (Imax_H to Imax_L) by limiting a drive current of the pull-up transistor P1. In the figure, Imax_H is an example without limiting the drive current of the pull-up transistor P1.

Then, at the time t1, the driving ability of the drive circuit VIRPWR_DRV is switched. The pull-up transistor P1 is turned off, the pull-up transistor P2 is turned on, the internal supply voltage INTVDD is provided to the output end as the virtual voltage VIRPWR via the pull-up transistor P2 with the strong driving ability, and the bit line selecting circuit charges the selective bit line and the non-selective bit line by using the virtual voltage VIRPWR with the strong driving ability during the time from t1 to t2. It should be noted herein that since a target voltage for charging the bit lines is at an internal supply voltage INTVDD level (1.8 V), in order to prevent the external supply voltage EXVDD from exceeding the target voltage during charging, the time t1 at which the driving ability is switched needs to be before a voltage of a bit line charged by using the external supply voltage EXVDD reaches the internal supply voltage INTVDD.

During the time from t2 to t3, a selective bit line connected to a selective storage cell to be programmed is discharged to a GND voltage level. In addition, a selective bit line connected to a non-selective storage cell with programming inhibited is maintained at a charging voltage. A latch circuit is set in the page buffer/readout circuit 10, the latch circuit maintains data input externally during the program operation, and according to "0" and "1" states of the data maintained by the latch circuit, an output node BLS of the page buffer/readout circuit becomes the GND voltage level or the internal supply voltage INTVDD level before the time t2. During the time from t2 to t3, the transistor BLSe is turned on, the transistor YBLe is turned off, and therefore the selective bit line GBLe connected to the selective storage cell is discharged to the GND voltage level through the page buffer/readout circuit 10, and the selective bit line GBLe connected to the non-selective storage cell is maintained at a charging voltage of the page buffer/readout circuit 10. On the other hand, the non-selective bit line is directly connected to the virtual voltage VIRPWR to maintain the charging voltage. In addition, since turning-off of the transistors is selected at a source line side not shown in the NAND strings, the source line SL will not affect storage cells/selective bit lines GBLe/non-selective bit lines GBLo in the NAND strings. For example, in FIG. 2, a storage cell MC1 is a selective storage cell to be programmed, and when a storage cell MC2 is a selective storage cell with programming inhibited, the selective bit lines GBLe connected to the storage cell MC1 are discharged to the GND voltage level, and the selective bit lines GBLe and the non-selective bit lines GBLo connected to the storage cell MC2 maintain the original charging voltage.

When the selective bit lines GBLe connected to the storage cell MC1 are discharged to the GND voltage level, the adjacent non-selective bit lines GBLo have voltage drop (an arrow Vdp in FIG. 3) through capacitive coupling Cp. Afterwards, the non-selective bit lines GBLo are recharged by the virtual voltage VIRPWR (provided by the internal supply voltage INTVDD with the strong driving ability at the moment) to restore. However, when a capacitive coupling ratio is large, the voltages of the non-selective bit lines GBLo drop greatly, so that the peak current Ip is increased. When the peak current Ip is increased, the internal supply voltage INTVDD will drop excessively, and because the internal supply voltage INTVDD is used for a logic circuit and other internal circuits at the same time, operations of the other internal circuits become instable. Additionally, the internal supply voltage INTVDD is generated via the external supply voltage EXVDD, so that when the peak current Ip is increased, the external supply voltage EXVDD may also drop, which further causes instability of other internal supply voltages and operations of the internal circuits.

The disclosure is directed to solve the existing problems, and provides a program method capable of reducing a peak current of a program operation and a semiconductor device.

A program method of a NAND flash memory of the disclosure includes the following steps. A first step for charging selective bit lines and non-selective bit lines by using a virtual voltage with a strong driving ability after using a virtual voltage with a weak driving ability. A second step for switching at least the non-selective bit lines to use the virtual voltage with the weak driving ability for charging when the selective bit lines connected to selective storage cells are discharged to a GND voltage level. A step for applying program voltages to selective word lines.

A semiconductor device of the disclosure includes: a storage cell array, including a plurality of storage cells; a program part, programming on a selective page of the storage cell array according to input data and address information; and a voltage generating circuit, controlled by the program part and having a function of selectively generating a virtual voltage with a weak driving ability and a virtual voltage with a strong driving ability. The program part charges selective bit lines and non-selective bit lines by using the virtual voltage with the weak driving ability during a first period, charges the selective bit lines and the non-selective bit lines by using the virtual voltage with the strong driving ability during a second period, and then switches at least the non-selective bit lines to use the virtual voltage with the weak driving ability for charging during a third period when the selective bit lines connected to selective storage cells are discharged to a GND voltage level.

According to the disclosure, at least the non-selective bit lines are switched to use the voltage with the weak driving ability for charging when the selective bit lines connected to the selective storage cells are discharged to the reference voltage level, and therefore a peak current can be lowered when the non-selective bit lines in capacitive coupling with the selective bit lines are recharged.

DESCRIPTION OF THE EMBODIMENTS

An implementation of the disclosure is illustrated below. In the implementation of the disclosure, a peak current is lowered in a program operation (e.g., a preset sequence is programmed) of an NAND flash memory. The peak current may be produced when voltage drop of bit lines is generated by the influence of capacitive coupling of the adjacent bit lines. Therefore, in the present implementation, the driving ability of a circuit driving the bit lines is regulated when voltage drop of the bit lines is produced so as to reduce the peak current in voltage drop of the bit lines without large compensation. The peak current of the disclosure is reduced during capacitive coupling of the adjacent bit lines, and during the period, the driving ability of the circuit driving the bit lines (e.g., a virtual voltage drive circuit) is switched from a strong driving ability to a weak driving ability.

Figure 1:
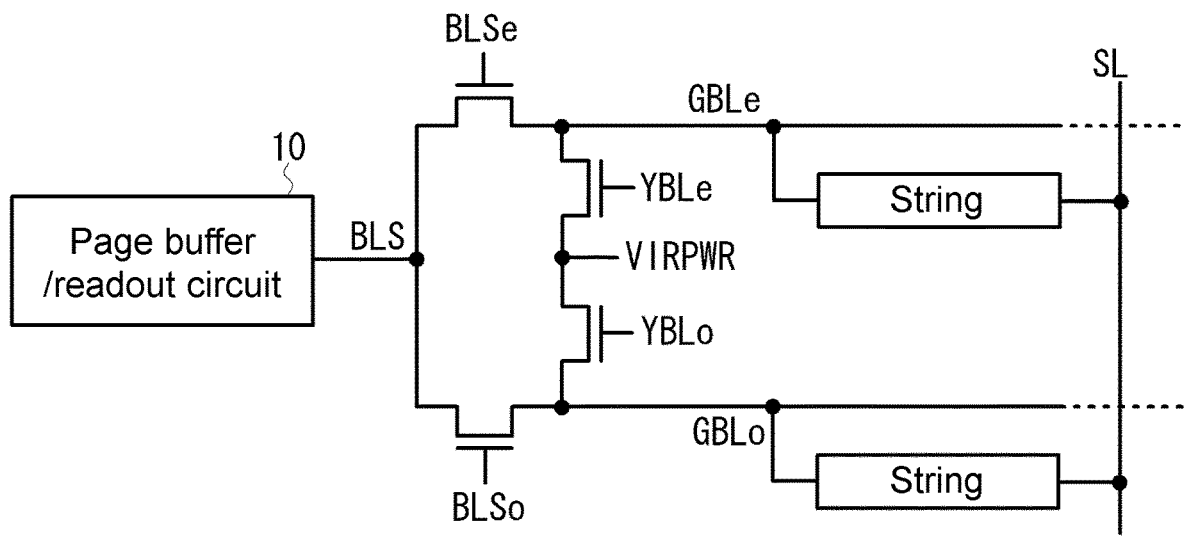
FIG. 1 is a figure representing the composition of a bit line selecting circuit of a flash memory.
Figure 2:
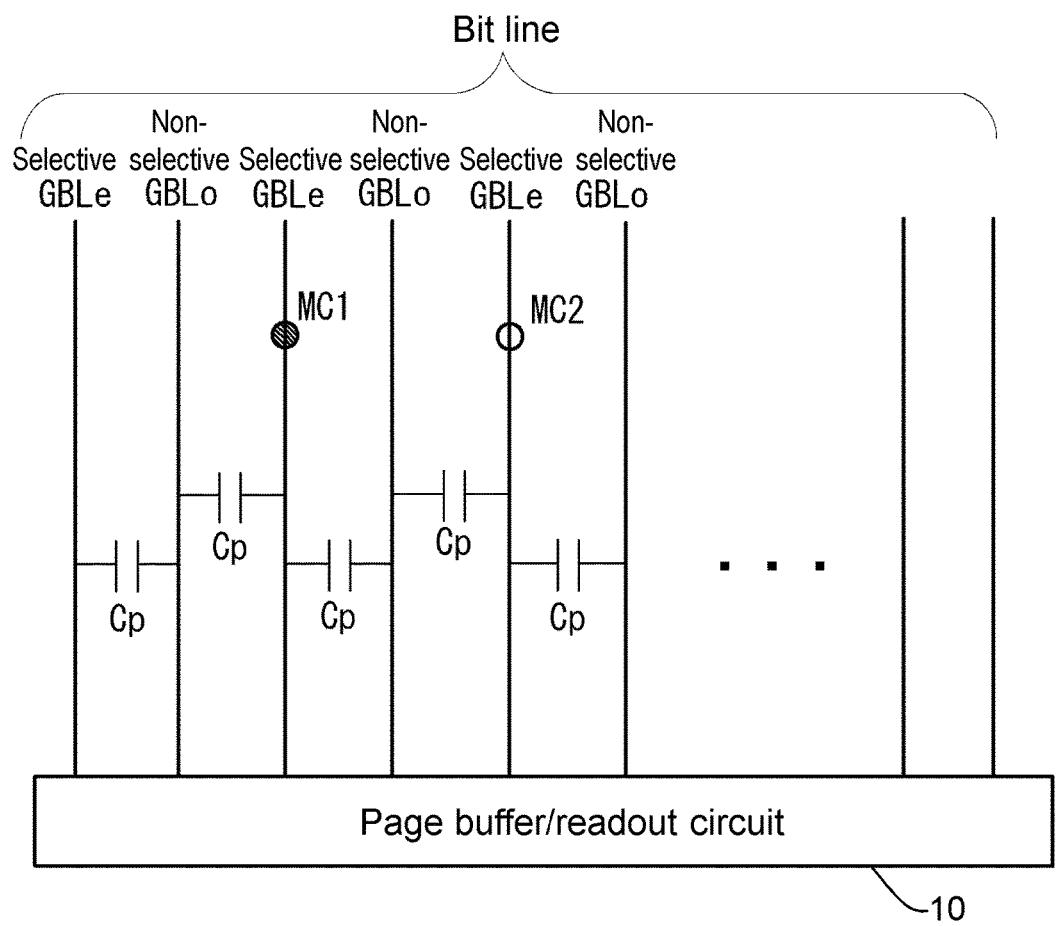
FIG. 2 is a figure schematically representing examples of selective bit lines and non-selective bit lines.

Embodiments of the disclosure are illustrated in detail with reference to drawings below. After the NAND flash memory receives a program instruction from the outside, a controller starts the program operation according to the program instruction. The controller sets selective bit lines as program voltages for programming or program inhibit voltages according to input data "0", "1" and row addresses, and then applies the program voltages to selective word lines according to line addresses so as to program selective storage cells. In addition, as shown in FIG. 1 and FIG. 2, a bit line selecting circuit is utilized to select even bit lines or odd bit lines, and the program operation is performed on selected even pages or odd pages.

Figure 3:
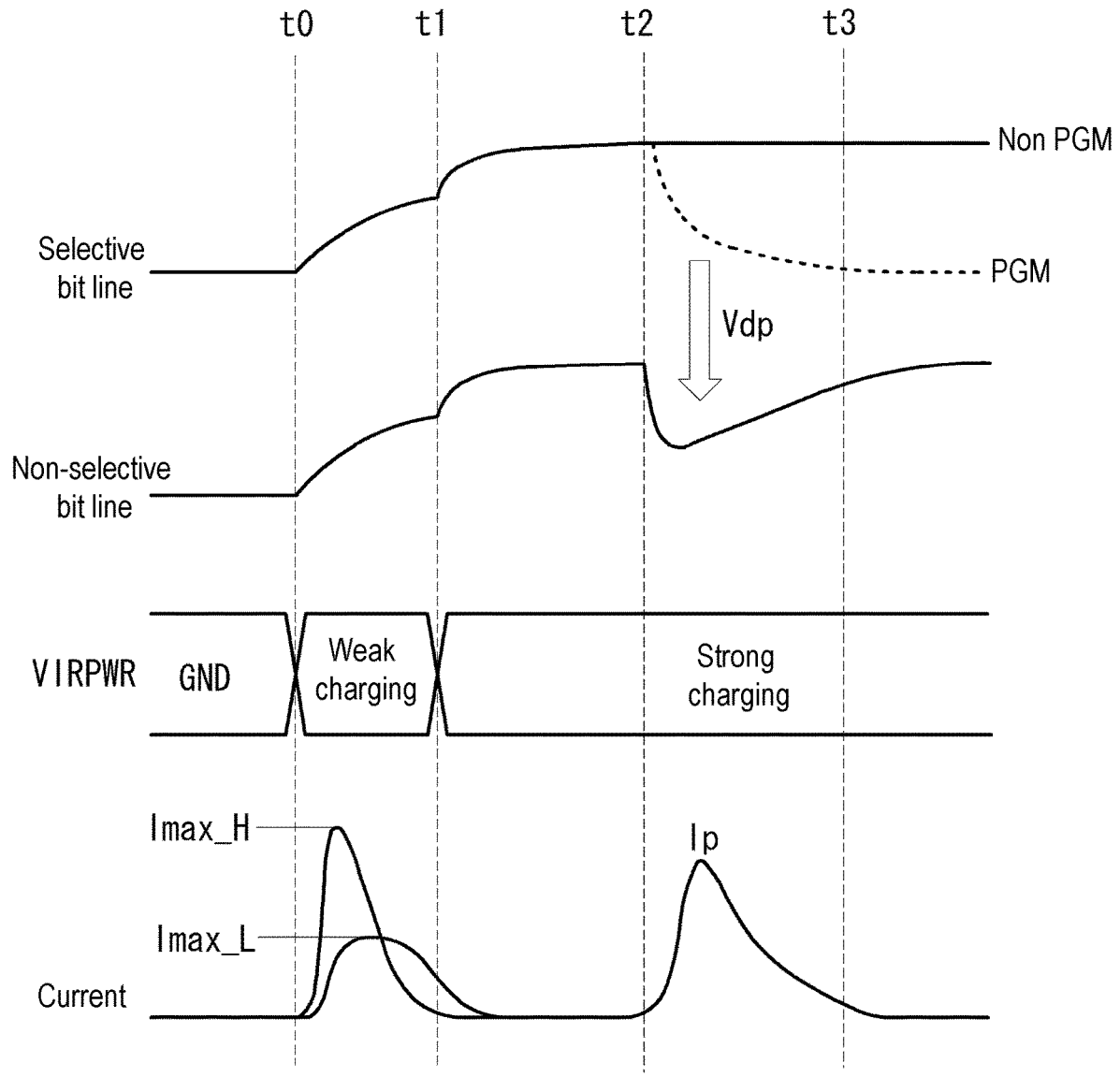
FIG. 3 is a figure illustrating a program operation of an existing flash memory.
Figure 5:
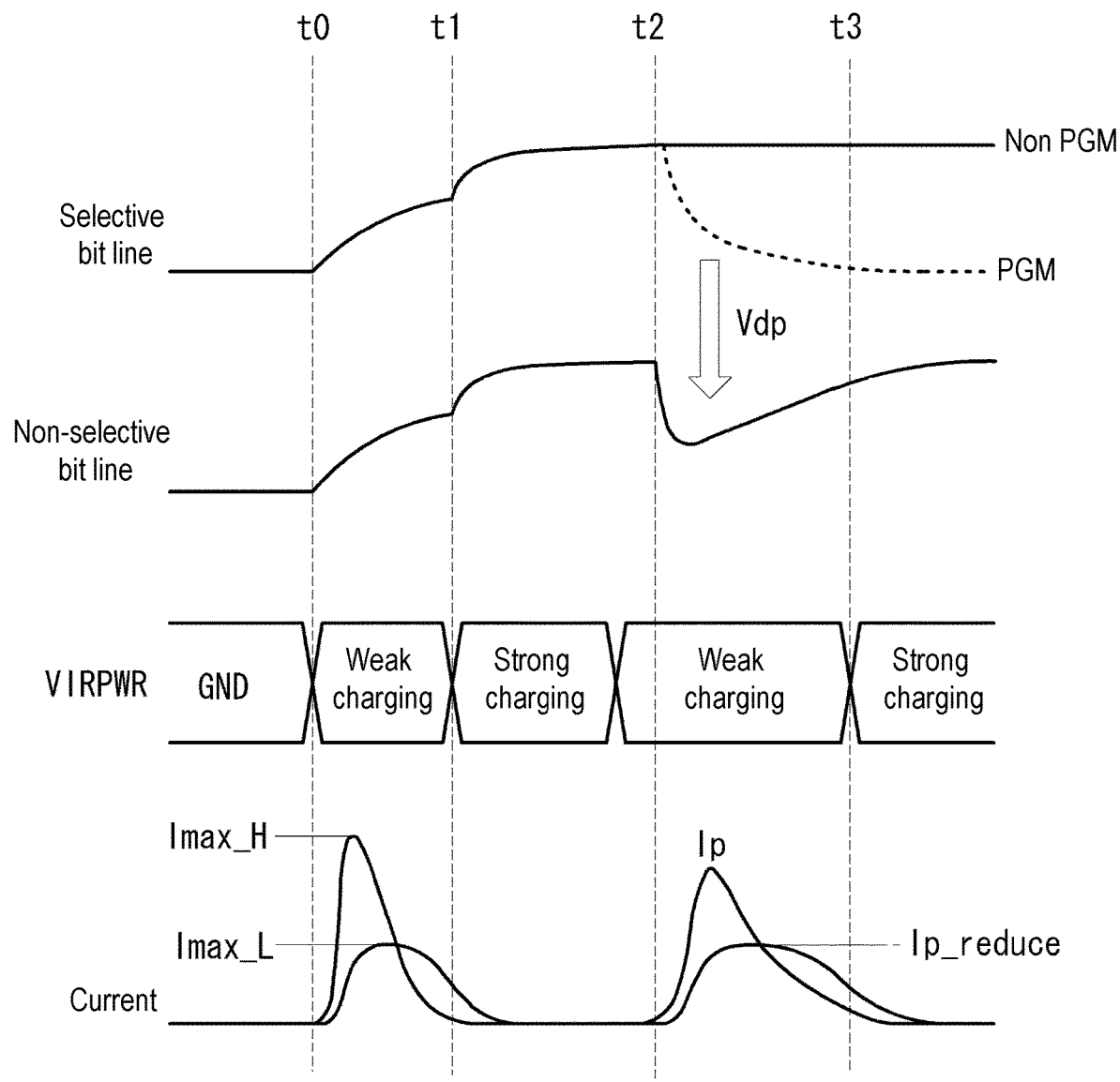
FIG. 5 is a figure illustrating a program operation of an embodiment of the disclosure.

FIG. 5 is a figure illustrating the program operation of an embodiment of the disclosure, and represents a sequence for presetting the program voltages for programming/program inhibit voltages for the bit lines. Different from a sequence shown in FIG. 3, in the present embodiment, when the selective bit lines connected to the selective storage cells are discharged to a GND voltage level during the time from t2 to t3, a driving ability of a virtual voltage drive circuit is switched from a strong driving ability to a weak driving ability, so that a peak current produced when non-selective bit lines with voltage drop are recharged is reduced.

During the time from t0 to t1, all the bit lines of the selective bit lines and the non-selective bit lines are charged by a virtual voltage VIRPWR with a weak driving ability supplied by the virtual voltage drive circuit. The peak current is produced because the bit lines have large capacitances and require large currents when charged. In order to lower the peak current, herein, the selective bit lines and the non-selective bit lines are charged by using the virtual voltage VIRPWR with the weak driving ability, such that the peak current may be lowered from Imax_H to Imax_L compared with the condition of charging with a virtual voltage VIRPWR with a strong driving ability.

Then, at the time t1, the virtual voltage drive circuit is switched from the weak driving ability to the strong driving ability. It should be noted herein that since a target voltage for charging the bit lines is an internal supply voltage INTVDD level (e.g., 1.8 V), a virtual voltage VIRPWR level needs to be lower than the target voltage after switching. In addition, if the bit lines are charged by using a virtual voltage VIRPWR higher than the target voltage during the time from t0 to t1, the time t1 at which the driving ability is switched needs to be before a voltage of the charged bit lines reaches an internal supply voltage INTVDD.

During the time from t1 to t2, the selective bit lines and the non-selective bit lines are charged by the virtual voltage VIRPWR with the strong driving ability, and these bit lines are then charged to the target voltage (e.g., 1.8 V). At the moment, since the selective bit lines and the non-selective bit lines have been charged by using the virtual voltage VIRPWR with the weak driving ability during the time from t0 to t1, no large peak current will be produced. In addition, in a preferred example, the selective bit lines and the non-selective bit lines may further be charged from a source line side at the same time. In this case, a source line is driven to the internal supply voltage INTVDD level (e.g., 1.8 V), and the selective bit lines and the non-selective bit lines are connected to the source line.

At the time t2, the selective storage cells (storage cells to be programmed) are programmed, the selective bit lines connected to the selective storage cells are connected to a page buffer/readout circuit 10 via the bit line selecting circuit, and the selective bit lines start to be discharged to the GND voltage level. Before the time t2, an output node BLS of the page buffer/readout circuit 10 is driven to the GND voltage level. Before and after the time t2, the driving ability of the virtual voltage drive circuit is switched from the strong driving ability to the weak driving ability. The switching time is set after the selective bit lines and the non-selective bit lines reach the target voltage and before the selective bit lines are discharged to the GND voltage level. In addition, the switching time may further be set to be synchronous with the time when the selective bit lines are connected to the page buffer/readout circuit 10 via the bit line selecting circuit.

During the time from t2 to t3, when the selective bit lines are discharged to the GND voltage level, voltages of the non-selective bit lines adjacent to the selective bit lines drop (referring to Vdp in FIG. 5). At the moment, the voltages of the non-selective bit lines are recharged by the virtual voltage VIRPWR with the weak driving ability to restore. Recharging is performed by utilizing the virtual voltage VIRPWR with the weak driving ability, so that the non-selective bit lines are not quickly charged compared with the condition of recharging with the virtual voltage VIRPWR with the strong driving ability, and thus, the peak current is restrained to be Ip_reduce. In addition, in one embodiment, during the time from t2 to t3, a voltage lower than the target voltage may be utilized for recharging to ensure that the non-selective bit lines will not exceed the target voltage by recharging. In the figure, Ip represents the magnitude of a peak current produced when the non-selective bit lines are quickly charged under the strong driving ability.

In the present embodiment, by restraining the peak current to Ip_reduce, voltage drop of the internal supply voltage INTVDD and an external supply voltage EXVDD caused by the peak current may be restrained. Accordingly, the influence on a logic circuit and other internal circuits utilizing the internal supply voltage INTVDD may be lowered. In addition, the influence on other internal supply voltages generated via the external supply voltage EXVDD as well as internal circuits may further be lowered.

Figure 4:
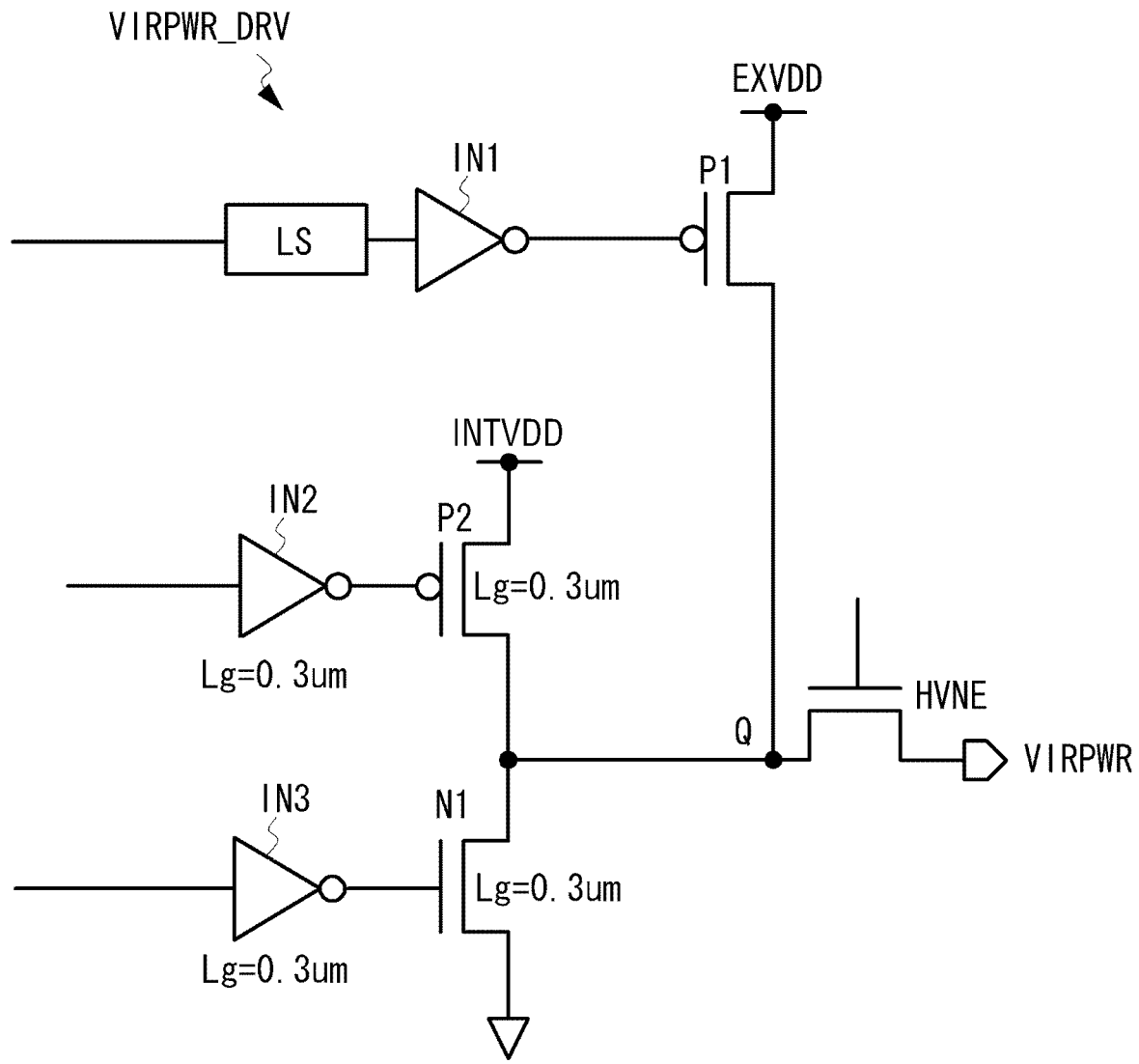
FIG. 4 is a figure representing an example of an existing virtual voltage drive circuit.
Figure 6:
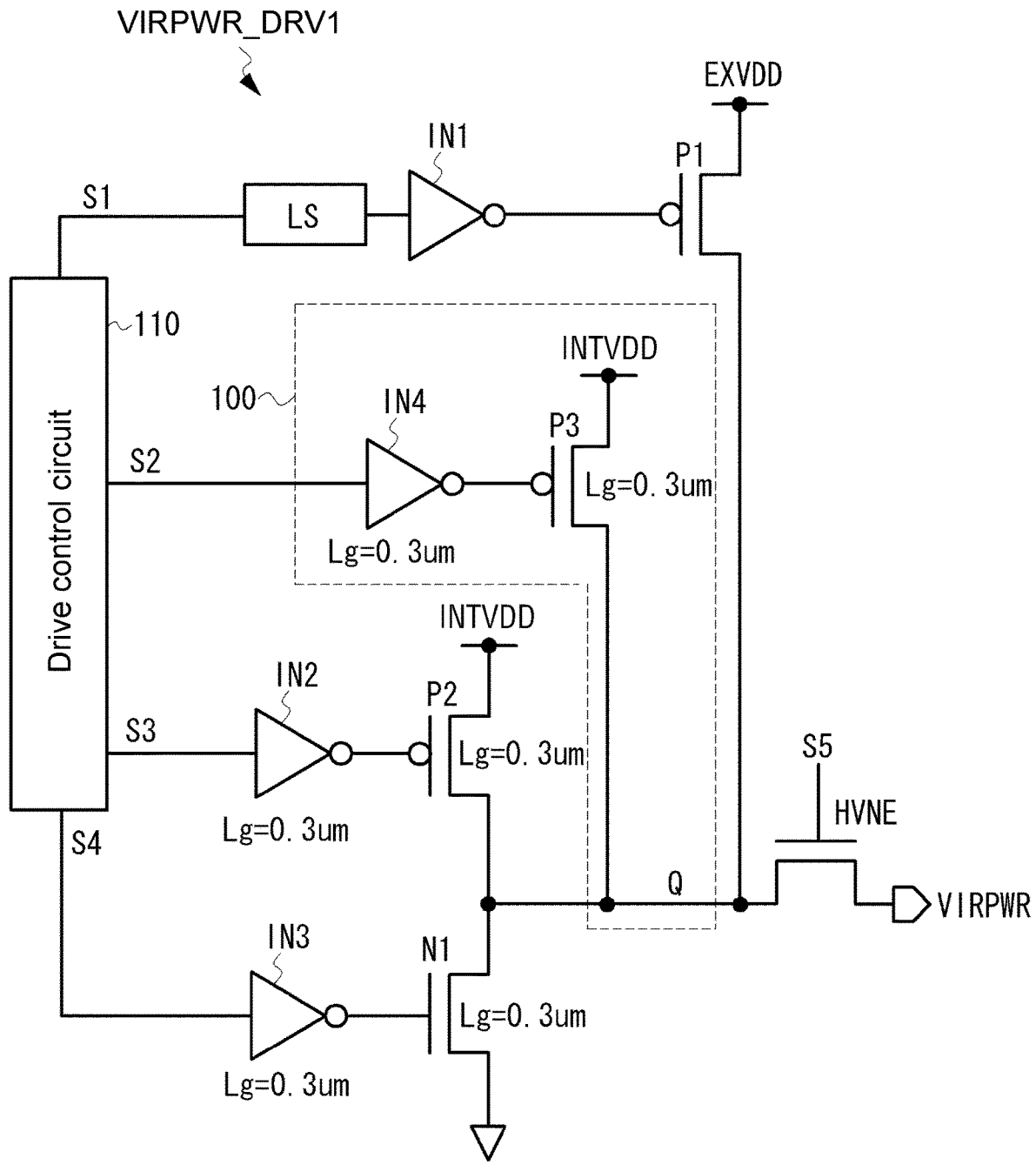
FIG. 6 is a figure representing an example of a virtual voltage drive circuit according to an embodiment of the disclosure.

FIG. 6 represents the composition of a virtual voltage drive circuit VIRPWR_DRV1 according to an embodiment of the disclosure. Compared with FIG. 4, the drive circuit VIRPWR_DRV1 of the present embodiment has an additional generating circuit 100.

The generating circuit 100 includes a P-type pull-up transistor P3 connected between an internal supply voltage INTVDD and an output node Q as well as an inverter IN4 driving the pull-up transistor P3. A grid length (0.3 μm) of the pull-up transistor P3 is the same as a pull-up transistor P2, but a W/L ratio of the pull-up transistor P3 is less than a W/L ratio of the pull-up transistor P2. That is, a drain current flowing when the pull-up transistor P3 is turned on is less than a drain current flowing when the pull-up transistor P2 is turned on. Accordingly, a driving ability of the pull-up transistor P3 is less than a driving ability of the pull-up transistor P2. In addition, the W/L ratio of the pull-up transistor P3 may further be the same as a W/L ratio of a pull-up transistor P1 connected to an external supply voltage EXVDD.

The pull-up transistors P2 to P3, a pull-down transistor N1 and PMOS/NMOS transistors forming inverters IN2 to IN4 may be driven by a low voltage (1.8 V). The transistors have no problem even if withstand voltages are low, so that a grid length Lg is 0.3 µm. On the other hand, the pull-up transistor P1 and an inverter IN1 may be driven by a high voltage (3.3 V) of the external supply voltage EXVDD, so that their grid lengths are 0.5 µm, and further, a level shifter LS is connected to the inverter IN1. A transistor HVNE, for example, may be driven by a high voltage (e.g., 5.4 V) generated by a charge pump, so that a high-voltage-resistant transistor may be used.

In a readout operation, a program operation and an erasing operation, a drive control circuit 110 outputs drive signals S1 to S5 to the level shifter LS, the inverters IN2 to IN4 and the transistor HVNE through a controller or a state machine not shown, so as to control a virtual voltage VIRPWR generated at an output end. The inverters IN1 to IN4 drive the pull-up transistors P1 to P3 and the pull-down transistor N1 according to the drive signals S1 to S4 at an H level or an L level. When the transistor HVNE is turned on through the drive signal S5, the driver circuit VIRPWR_DRV1 outputs the virtual voltage VIRPWR from the output end, and the virtual voltage VIRPWR is provided to a bit line selecting circuit to charge bit lines. When the transistor HVNE is turned off through the drive signal S5, the driver circuit VIRPWR_DRV1 is blocked from the bit line selecting circuit, and the bit lines are stopped being charged.

Next, the program operation of the flash memory of the present embodiment is illustrated. During the time from t0 to t1 as shown in FIG. 5, the drive control circuit 110 outputs the drive signals S1 and S4 to S5 at the H level, and outputs the drive signals S2 to S3 at the L level. Accordingly, the pull-up transistor P1 and the transistor HVNE are turned on, the pull-up transistors P2 to P3 and the pull-down transistor N1 are turned off, and the external supply voltage EXVDD is provided to the output end as the virtual voltage VIRPWR via the pull-up transistor P1 with a weak driving ability.

During the time from t1 to t2, the drive control circuit 110 outputs the drive signal S1 at the L level, and the drive signals S2 to S5 at the H level. Accordingly, the pull-up transistor P1 and the pull-down transistor N1 are turned off, the pull-up transistors P2 to P3 are and the transistor HVNE are turned on, the internal supply voltage INTVDD is provided to the output end as the virtual voltage VIRPWR via the pull-up transistor P2 with a strong driving ability and the pull-up transistor P3 with a weak driving ability at the same time, and therefore the virtual voltage VIRPWR has the strong driving ability at the moment.

At the time t2, selective storage cells start to be programmed, and selective bit lines start to be discharged to a GND voltage level. Before and after the time t2, the driving ability of the virtual voltage VIRPWR is switched to the weak driving ability. Specifically, the drive control circuit 110 makes the drive signal S3 changed from the H level to the L level, and accordingly, the pull-up transistor P2 with the strong driving ability is turned off. At the moment, the internal supply voltage INTVDD is provided to the output end as the virtual voltage VIRPWR only via the pull-up transistor P3 with the weak driving ability, so that the virtual voltage VIRPWR has the weak driving ability at the moment. The switching time of the driving ability of the virtual voltage VIRPWR is set after the selective bit lines and non-selective bit lines reach a target voltage and before the selective bit lines are discharged to the GND voltage level. In addition, the switching time may further be set to be synchronous with the time when the selective bit lines are connected to the page buffer/readout circuit 10 via the bit line selecting circuit.

It is noted herein that at the time t2, since the selective bit lines are discharged to the GND voltage level, voltages of the non-selective bit lines in capacitive coupling with the selective bit lines drop, at the moment, in the drive circuit VIRPWR_DRV1, the internal supply voltage INTVDD is provided to the output end as the virtual voltage VIRPWR only via the pull-up transistor P3 with the weak driving ability, so that the voltages of the non-selective bit lines may be gently recharged. Further, the peak current may be reduced to Ip_reduce.

After discharging of the selective bit lines (i.e., program data are preset for the selective bit lines), the drive control circuit 110 makes the drive signal S3 changed from the L level to the H level, and makes the pull-up transistor P2 turned on again. Accordingly, the internal supply voltage INTVDD is provided to the output end as the virtual voltage VIRPWR via the pull-up transistor P2 with the strong driving ability and the pull-up transistor P3 with the weak driving ability at the same time, so that the virtual voltage VIRPWR has the strong driving ability at the moment. Then, a word line selecting/drive circuit (not shown) applies program voltages to selective word lines according to input line addresses, so that the selective storage cells are programmed.

According to the present embodiment, when the selective bit lines connected to the selective storage cells are discharged to the GND voltage level (namely the time t2), the driving ability of the virtual voltage VIRPWR is limited during recharging of the non-selective bit lines in capacitive coupling with the selective bit lines (i.e., the internal supply voltage INTVDD is provided to the output end only via the pull-up transistor P3 with the weak driving ability so as to limit drive currents), and therefore the peak current may be reduced.

Figure 7:
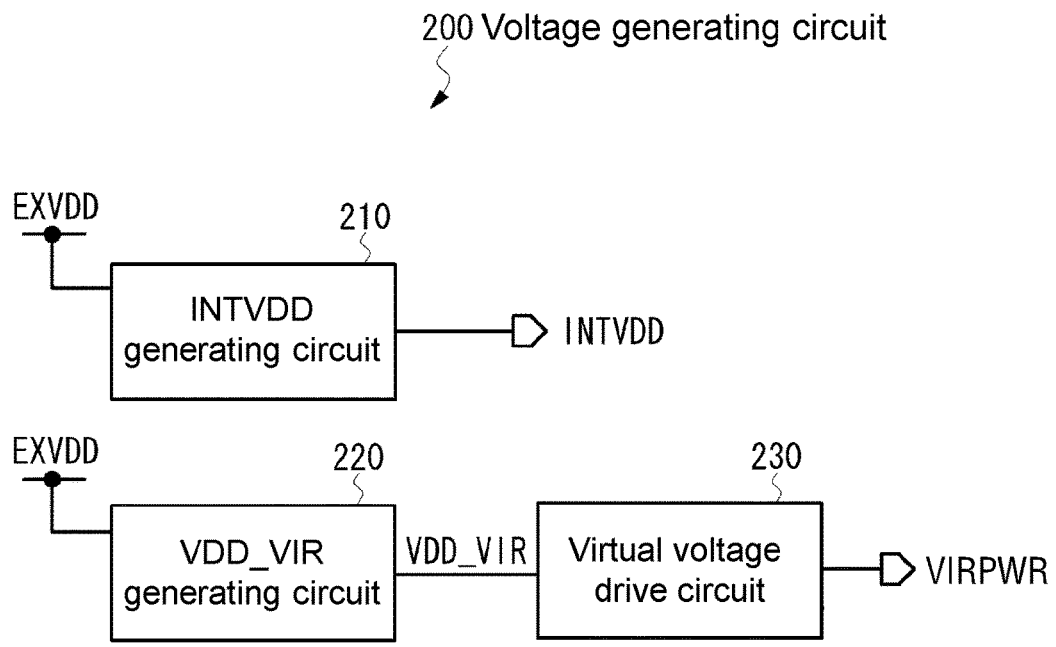
FIG. 7 is a figure representing an example of an internal supply voltage generating circuit of an embodiment of the disclosure.

The other embodiment of the disclosure is illustrated below. FIG. 7 is a figure representing the composition of a voltage generating circuit 200 carried on a flash memory of the present embodiment. The voltage generating circuit 200 of the present embodiment generates various voltages required for a readout operation, a program operation, an erasing operation, etc.

The voltage generating circuit 200 includes: an INTVDD generating circuit 210, generating an internal supply voltage INTVDD by using an externally-supplied external supply voltage EXVDD; a VDD_VIR generating circuit 220, generating an internal supply voltage VDD_VIR by using the external supply voltage EXVDD; and a virtual voltage drive circuit 230, generating virtual voltages VIRPWR with different driving abilities by using the internal supply voltage VDD_VIR. The external supply voltage EXVDD is, for example, 3.3 V, and the internal supply voltage INTVDD and the internal supply voltage VDD_VIR are, for example, 1.8 V.

Figures 8A, 8B:
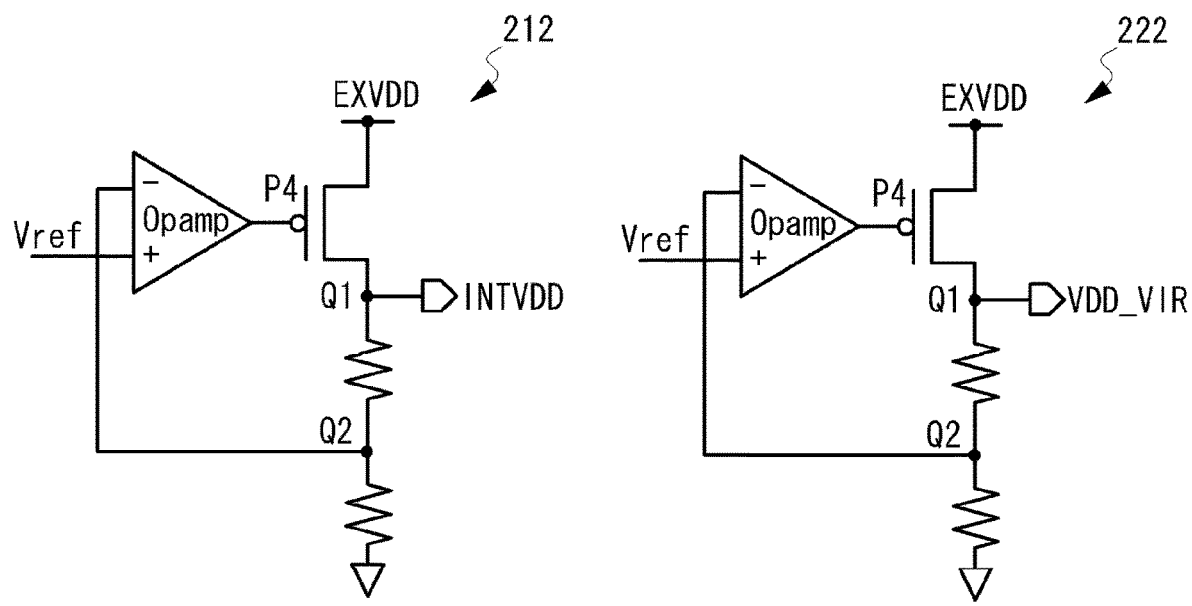
FIG. 8(A) and FIG. 8(B) are figures representing an example of a regulator for generating an internal supply voltage according to an embodiment of the disclosure.

The INTVDD generating circuit 210 includes a regulator 212 as shown in FIG. 8(A). The regulator 212 includes: a PMOS transistor P4, connected between the external supply voltage EXVDD and an output node Q1; a resistive voltage divider, connected between the output node Q1 and a ground terminal; and an operational amplifier (differential amplifier) Opamp. The operational amplifier Opamp is configured to compare a voltage of a node Q2 obtained after voltage division by the resistive voltage divider with a reference voltage Vref, and control, according to comparison results, the transistor P4 to output the internal supply voltage INTVDD making the external supply voltage EXVDD drop from the output node Q1. The internal supply voltage INTVDD is used for a logic circuit and other internal circuits.

The VDD_VIR generating circuit 220 includes a regulator 222 as shown in FIG. 8(B). The regulator 222 has the same composition with the regulator 212, and the internal supply voltage VDD_VIR of 1.8 V making the external supply voltage EXVDD drop is output from the output node Q1. It should be specially noted that the internal supply voltage VDD_VIR is special for the virtual voltage drive circuit 230, rather than being supplied to the logic circuit and other internal circuits.

Figure 9:
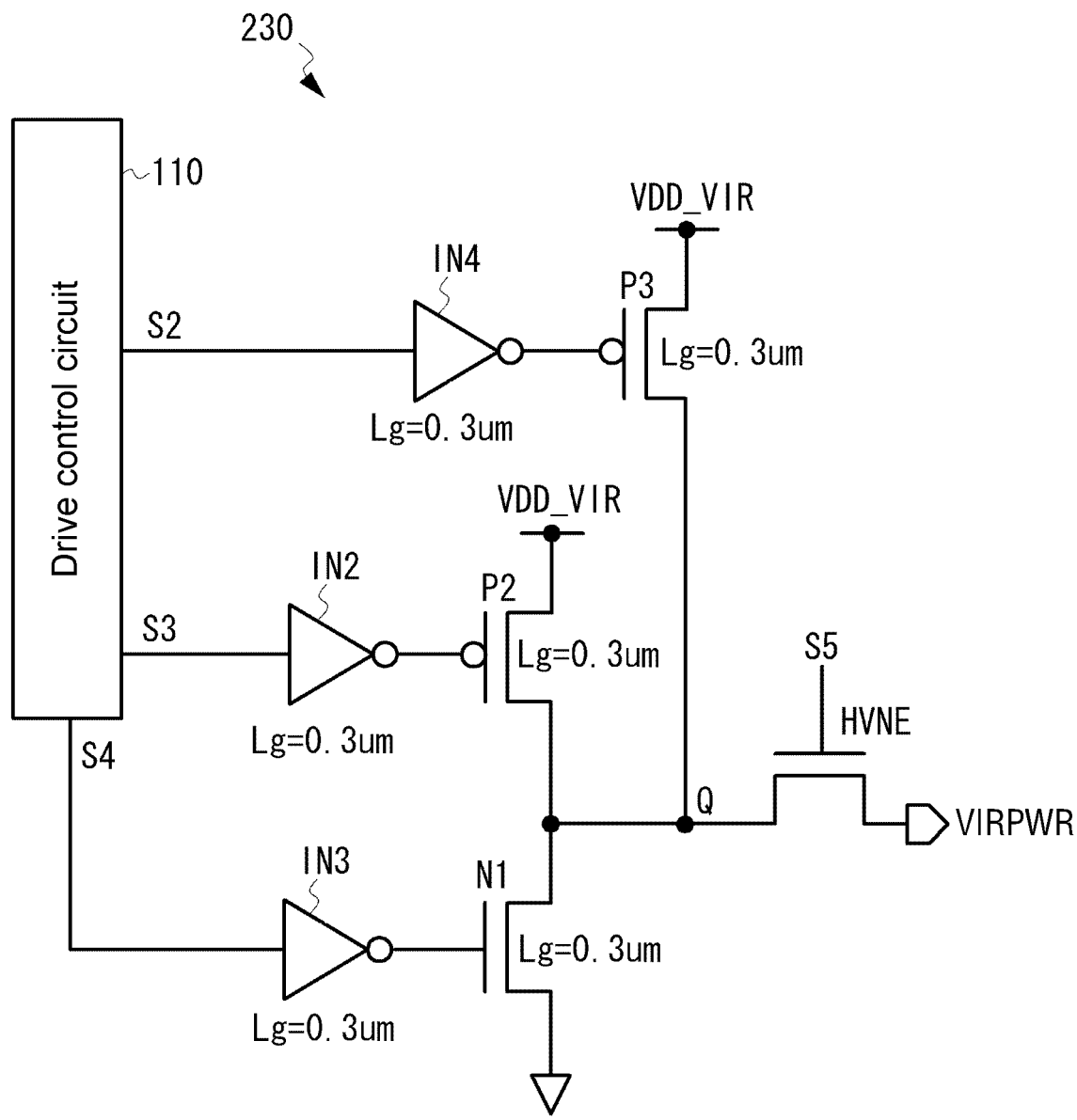
FIG. 9 is a figure representing the composition of a virtual voltage drive circuit according to a second embodiment of the disclosure.

FIG. 9 represents the composition of the virtual voltage drive circuit 230 according to the present embodiment. Compared with the drive circuit VIRPWR_DRV1 shown in FIG. 6, the drive circuit 230 of the present embodiment provides a voltage VDD without using the external supply voltage EXVDD, thereby avoiding a pull-up transistor P1, an inverter IN1, a level shifter LS and other circuits configured to provide the external supply voltage EXVDD to an output end. In addition, the drive circuit 230 only uses the internal supply voltage VDD_VIR special for the virtual voltage drive circuit 230 to generate virtual voltages VIRPWR with different driving abilities.

When the program operation is performed, through different drive signals S2 to S5, the drive control circuit 110 controls the drive circuit 230 to provide the virtual voltages VIRPWR with the different driving abilities to a bit line selecting circuit for charging bit lines. Referring to FIG. 5 and FIG. 9, during the time from t0 to t1, the drive control circuit 110 outputs the drive signals S2 and S4 to S5 at an H level and the drive signal S3 at an L level to turn on a pull-up transistor P3 and a transistor HVNE and turn off a pull-up transistor P2 and a pull-down transistor N1. Accordingly, the internal supply voltage VDD_VIR is provided to the output end as the virtual voltage VIRPWR only via the pull-up transistor P3 with a weak driving ability, and the virtual voltage VIRPWR has the weak driving ability at the moment.

Then, during the time from t1 to t2, the drive control circuit 110 makes the drive signal S3 switched to the H level, and makes the pull-up transistor P2 turned on. Accordingly, the internal supply voltage VDD_VIR is provided to the output end as the virtual voltage VIRPWR via the pull-up transistor P2 with the strong driving ability and the pull-up transistor P3 with the weak driving ability at the same time, so that the virtual voltage VIRPWR has the strong driving ability at the moment.

At the time t2, selective storage cells start to be programmed, and selective bit lines start to be discharged to a GND voltage level. Before and after the time t2, the driving ability of the virtual voltage VIRPWR is switched to the weak driving ability. Specifically, the drive control circuit 110 makes the drive signal S3 changed from the H level to the L level, and turns off the pull-up transistor P2 with the strong driving ability. Accordingly, the internal supply voltage VDD_VIR is provided to the output end as the virtual voltage VIRPWR only via the pull-up transistor P3 with the weak driving ability, and the virtual voltage VIRPWR has the weak driving ability at the moment. The switching time of the driving ability of the virtual voltage VIRPWR is set after the selective bit lines and non-selective bit lines reach a target voltage and before the selective bit lines are discharged to the GND voltage level. In addition, the switching time may further be set to be synchronous with the time when the selective bit lines are connected to the page buffer/readout circuit 10 via the bit line selecting circuit.

It is noted herein that at the time t2, since the selective bit lines are discharged to the GND voltage level, voltages of the non-selective bit lines in capacitive coupling with the selective bit lines drop. At the moment, by turning off the pull-up transistor P2, the internal supply voltage VDD_VIR is provided to the output end as the virtual voltage VIRPWR only via the pull-up transistor P3 with the weak driving ability, so that the voltages of the non-selective bit lines may be gently recharged. Further, the peak current may be reduced to Ip_reduce.

According to the present embodiment, the virtual voltage drive circuit 230 does not use the external supply voltage EXVDD (e.g., 1.8 V) higher than the target voltage (e.g., 1.8 V) to generate the virtual voltage VIRPWR, so that it can be ensured that the bit lines will not be charged higher than the target voltage. Therefore, the switching time t1 of the driving ability of the virtual voltage VIRPWR can have no limit, the peak current also can be further lowered, and meanwhile, the area of a circuit providing an external supply voltage as a virtual voltage can be reduced. In addition, the drive circuit 230 uses the special internal supply voltage VDD_VIR to generate the virtual voltage VIRPWR, such that the influence of the peak current on the internal supply voltage INTVDD can be lowered, and normal running of other circuits, such as the logic circuit, using the internal supply voltage INTVDD for charging is guaranteed.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A program method, being a program method of an NAND flash memory, comprising:
  a first step for charging selective bit lines and non-selective bit lines by using a virtual voltage with strong driving ability after using a virtual voltage with weak driving ability;
  a second step for switching at least the non-selective bit lines to use the virtual voltage with weak driving ability for charging when the selective bit lines connected to selective storage cells are discharged to a GND voltage level; and
  a step for applying program voltages to selective word lines.

2. The program method according to claim 1, wherein
  in the first step, the selective bit lines and the non-selective bit lines are charged from a bit line side and a source line side,
  in the second step, the selective bit lines connected to the selective storage cells are discharged from the bit line side by using a page buffer/readout circuit, and the non-selective bit lines are charged from the bit line side by using a virtual voltage.

3. The program method according to claim 1, wherein in the second step, switching the non-selective bit lines to use the virtual voltage with weak driving ability for charging is implemented before discharging the selective bit lines connected to the selective storage cells.

4. The program method according to claim 1, wherein the second step, switching the non-selective bit lines to use the virtual voltage with weak driving ability for charging is implemented synchronously with a time of discharging the selective bit lines connected to the selective storage cells.

5. The program method according to claim 1, wherein the virtual voltage with weak driving ability in the first step is generated by an external supply voltage, and the virtual voltage with weak driving ability in the second step is generated by an internal supply voltage lower than the external supply voltage.

6. A semiconductor device, comprising:
- a storage cell array, comprising a plurality of storage cells;
- a program part, programming on a selective page of the storage cell array according to input data and address information; and
- a drive circuit, controlled by the program part and having a function of selectively generating a virtual voltage with weak driving ability and a virtual voltage with strong driving ability; wherein
the program part charges selective bit lines and non-selective bit lines by using the virtual voltage with weak driving ability during a first period; charges the selective bit lines and the non-selective bit lines by using the virtual voltage with strong driving ability during a second period; and then switches at least the non-selective bit lines to use the virtual voltage with weak driving ability for charging during a third period when the selective bit lines connected to selective storage cells are discharged to a GND voltage level.

7. The semiconductor device according to claim 6, wherein the drive circuit comprises: a first transistor, providing a first voltage with weak driving ability; a second transistor, providing a second voltage with strong driving ability; and a control circuit, controlling operations of providing the first voltage and the second voltage of the first transistor and the second transistor, wherein a width/length ratio of the first transistor is less than a width/length ratio of the second transistor.

8. The semiconductor device according to claim 7, wherein the first transistor provides the first voltage with weak driving ability from an internal supply voltage, and the second transistor provides the second voltage with strong driving ability from an internal supply voltage.

9. The semiconductor device according to claim 7, wherein the drive circuit further comprises a third transistor, providing a third voltage with weak driving ability from an external supply voltage; and the program part uses the third voltage with weak driving ability provided by the third transistor as the virtual voltage with weak driving ability during the first period, and uses the first voltage with weak driving ability provided by the first transistor as the virtual voltage with weak driving ability during the third period.

10. The semiconductor device according to claim 8, wherein the drive circuit further comprises a third transistor, providing a third voltage with weak driving ability from an external supply voltage; and the program part uses the third voltage with weak driving ability provided by the third transistor as the virtual voltage with weak driving ability during the first period, and uses the first voltage with weak driving ability provided by the first transistor as the virtual voltage with weak driving ability during the third period.

11. The semiconductor device according to claim 6, wherein the program part discharges the selective bit lines connected to the selective storage cells from a bit line side by using a page buffer/readout circuit, and charges the non-selective bit lines from the bit line side by using a virtual voltage.

* * * * *